United States Patent [19]
Yin et al.

[11] Patent Number: 5,723,992
[45] Date of Patent: Mar. 3, 1998

[54] LOW LEAKAGE OUTPUT DRIVER CIRCUIT WHICH CAN BE UTILIZED IN A MULTI-VOLTAGE SOURCE

[75] Inventors: Patrick Yin, Fremont; Craig S. Thrower, San Jose, both of Calif.

[73] Assignee: Aspec Technology, Inc., Sunnyvale, Calif.

[21] Appl. No.: 545,158

[22] Filed: Oct. 19, 1995

[51] Int. Cl.$^6$ .................... H03K 17/687; H03K 17/16
[52] U.S. Cl. .................... 327/112; 327/321; 326/83
[58] Field of Search .................... 327/112, 203, 327/205, 206, 312, 321, 328, 333, 379, 391, 409, 410; 326/27, 34, 80, 81, 83, 85

[56] References Cited

U.S. PATENT DOCUMENTS

| | | | |
|---|---|---|---|
| 5,121,000 | 6/1992 | Naghshineh | 327/312 |
| 5,124,579 | 6/1992 | Naghshineh | 326/83 |
| 5,237,213 | 8/1993 | Tanoi | 327/379 |
| 5,239,211 | 8/1993 | Jinbo | 326/83 |
| 5,293,082 | 3/1994 | Bathaee | 327/379 |
| 5,389,834 | 2/1995 | Kinugasa et al. | 327/333 |
| 5,430,335 | 7/1995 | Tanoi | 327/379 |
| 5,430,404 | 7/1995 | Campbell et al. | 327/379 |
| 5,438,278 | 8/1995 | Wong et al. | 326/83 |
| 5,525,917 | 6/1996 | Wong et al. | 327/328 |
| 5,546,020 | 8/1996 | Lee et al. | 326/83 |
| 5,548,229 | 8/1996 | Segawa et al. | 326/83 |

*Primary Examiner*—Timothy P. Callahan
*Assistant Examiner*—My-Trang Nu Ton
*Attorney, Agent, or Firm*—Sawyer & Associates

[57] ABSTRACT

An improved output driver circuit is disclosed which can be utilized when a plurality of voltage potentials are present. The output driver circuit comprises a first pull-up transistor coupled to a first voltage potential, a second pull-down transistor coupled to a second voltage potential, and a pad member coupled to the first pull-up and second pull-down transistor. The driver circuit further includes a circuit means which is coupled to the pad member and the first pull-up transistor. Accordingly, through this arrangement, the circuit substantially reduces the leakage through the first pull-up transistor when the pad member is coupled to a third voltage potential. An output driver circuit in accordance with the present invention, can be utilized in an integrated circuit environment where multiple voltages such as 3.3 volts and 5 volts are present and the output driver circuit will operate effectively because the leakage path normally associated with such circuits is substantially minimized.

12 Claims, 4 Drawing Sheets

LOW LEAKAGE OUTPUT DRIVER CIRCUIT WHICH CAN BE UTILIZED IN A MULTI-VOLTAGE SOURCE

FIELD OF THE INVENTION

The present invention relates generally to input/output circuits and more particularly to input/output circuits which can be utilized with the plurality of voltage sources.

BACKGROUND OF THE INVENTION

As the complexity of Integrated Circuit becoming higher, the number of CMOS transistors integrated on a piece of silicon increases proportionately. In order to keep the power dissipation and switching noise under control, power supply to the chip is reduced, e.g. from 5 volts to 3.3 volts. Since the performance of a CMOS circuit is a function of its power supply, this reduction in power supply invariably results in lower circuit speed. More advanced CMOS process with much finer feature sizes and lower transistor threshold voltages are typically used to compensate for the lower power supply. However, other devices that this circuit may communicate with may not be of reduced size and threshold voltage. Thus, a Very Large Scale Integrated (VLSI) chip designed to operate at 3.3 volts may need to interface with another chip operating at 5 volts.

To perform the interface properly requires special circuit or device techniques to avoid stress on components designed for 3.3 volts operation. The alternative is added cost for extra manufacturing steps necessary to make devices which can tolerate higher voltages at the input/output circuits for the integrated circuit. Most 0.5 μm CMOS processes are designed to operate under 3.3 volt power supply voltage.

Increasingly, some system boards have a mixture of IC's operating under different power supply voltages—typically 5 volt and 3.3 volt, in order to achieve (or meet) the necessary system performance specifications. Therefore, there is a need for IC's with different power supply to interface with each other at the I/O (input and output) levels. An IC manufactured with a "3.3V" process needs to be protected when I/O pins are driven by signals with 0 to 5 volt excursions. Applying 5 volt across a "3.3V" transistor can cause long term degradation to the transistor gate-oxide. Furthermore, special circuit techniques need to be deployed to ensure current leakage at the interface to a minimum. Excessive leakage can cause 1) erroneous voltage level at the interface, 2) elevated power consumption. Some manufacturers opted to use special fabrication processes to take care of the gate-oxide reliability problem and using special circuit techniques to reduce output leakage.

Another method described is by utilizing a depletion mode transistor at the output of the gate oxide. However, a depletion mode transistor requires a significant modification of conventional processing technology. There is typically a higher manufacture loss associated with non-conventional processes.

What is needed therefore is a circuit that can be manufactured on existing processes that eliminates the above-mentioned problems with the prior art I/O circuits and at the same time is adaptable to varying supply voltages. The present invention addresses such a need.

SUMMARY OF THE INVENTION

An improved output driver circuit is disclosed which can be utilized when a plurality of voltage potentials are present. The output driver circuit comprises a first pull-up transistor means coupled to a first voltage potential, a second pull-down transistor means coupled to a second voltage potential, and a pad member coupled to the first pull-up and second pull-down transistor means. The driver circuit further includes a circuit means coupled to the pad member, the gate means and the first pull-up transistor means. Accordingly, through this arrangement, the circuit means substantially reduces the leakage through the first pull-up transistor and voltage across the drain-gate of the first pull-up transistor when the pad member is coupled to a third voltage potential.

An output driver circuit in accordance with the present invention, can be utilized in an integrated circuit environment where multiple voltages such as 3.3 volts and 5 volts are present and the output driver circuit will operate effectively because the leakage path and gate-drain voltage normally associated with such circuits is substantially minimized.

DETAILED DESCRIPTION

The present invention is directed toward an improvement in an input/output (I/O) driver circuit. The following description is presented to enable one of ordinary skill in the art to make and use the invention as provided in the context of a particular application and its requirements. Various modifications to the preferred embodiment will be readily apparent to those skilled in the art, and the generic principles defined here may be applied to other embodiments. Thus, the present invention is not intended to be limited to the embodiments shown, but is to be accorded the widest scope consistent with the principles and novel features disclosed herein.

Figure 1:
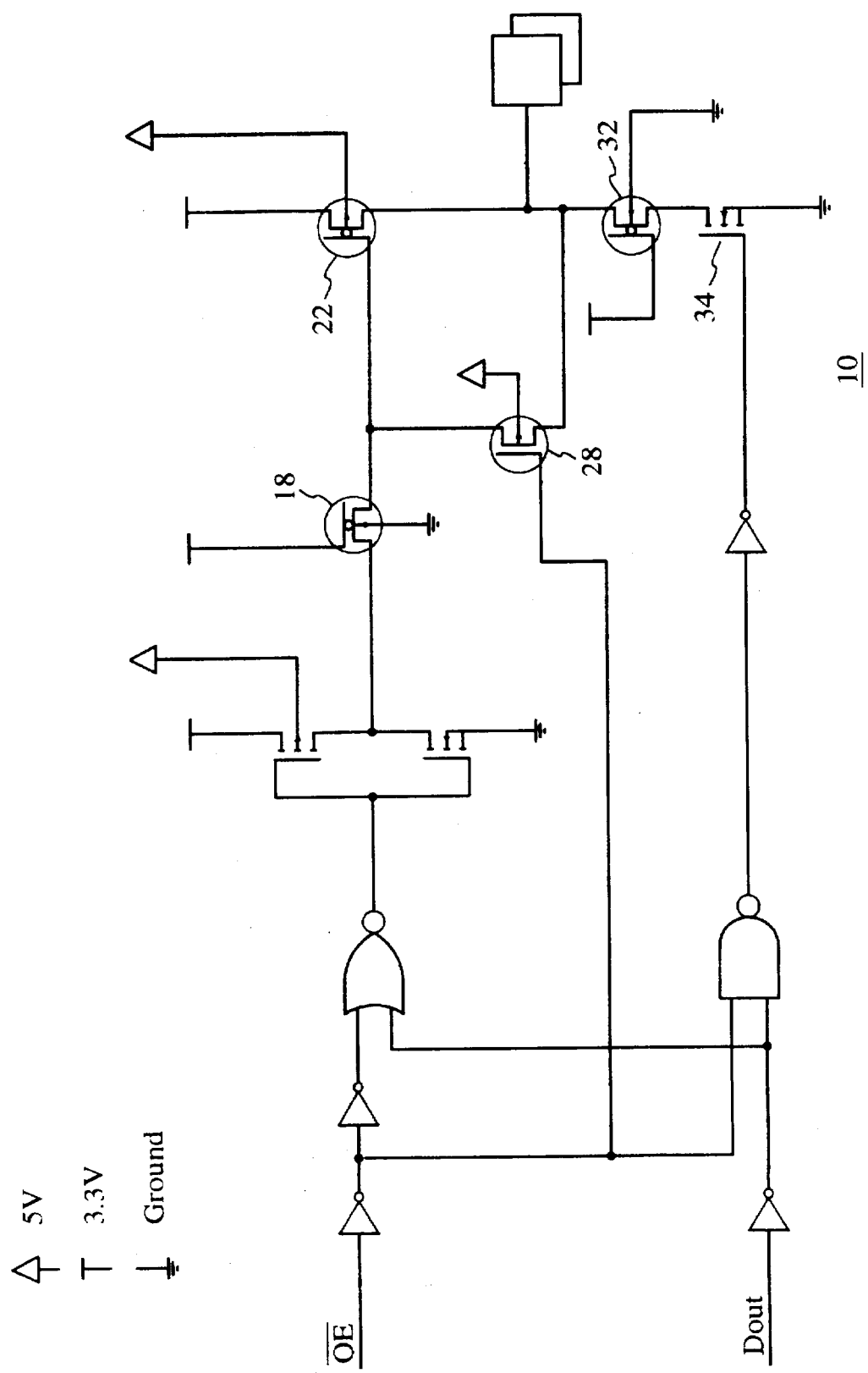
FIG. 1 is a schematic diagram of a first conventional output driver circuit.

Referring now to FIG. 1, what is shown is a circuit diagram of a conventional output driver circuit 10. As is seen, a serially connected depletion mode transistor is utilized to suppress hot carrier generation and at the same time safeguard thin gate oxide by reducing the gate to drain and gate to source voltage of the MOSFET transistors. Transistor 22 is an intrinsic P-type and transistor 32 is an intrinsic N-type. Transistor 38 is a depletion mode P-type transistor. Although this works effectively for its intended purpose, it requires different manufacturing processing steps from a traditional manufacturing process and thereby significantly increases the cost of manufacturing.

Figure 2:
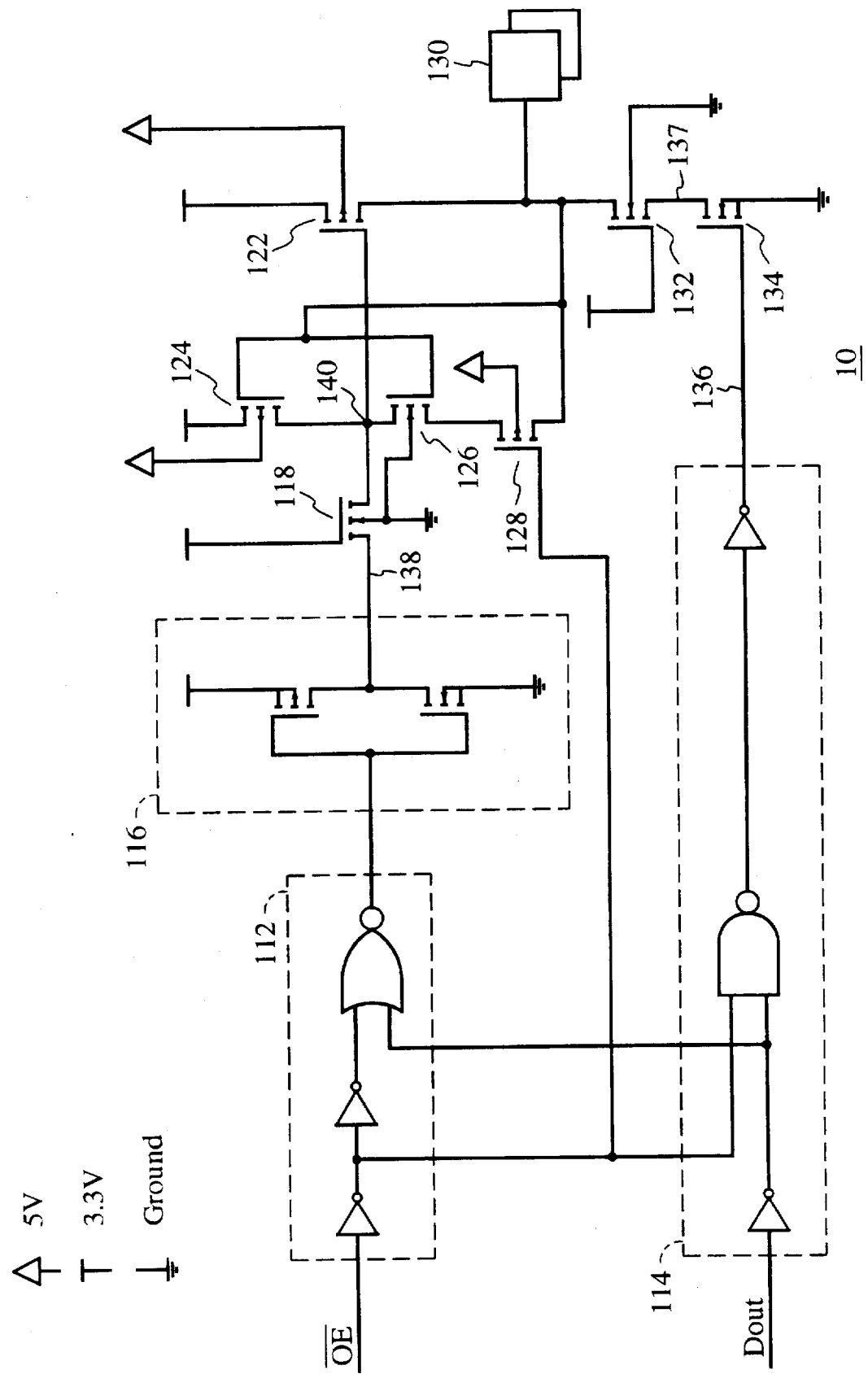
FIG. 2 is a schematic diagram of a first embodiment of an output driver circuit in accordance with the present invention.

FIG. 2 is a first embodiment of a CMOS output driver circuit 100 in accordance with the present invention. The driver stage includes a set of lines including DATA and ENABLE lines. The DATA and ENABLE lines feed pre-driver circuits 112 and 114 which develop a pair of voltages, $V_P$ and $V_N$ which range between 0.0 V and 3.3 V. The predriver circuits 112 and 114 provide the low and high pair of signals. Hence, predriver circuit 112 is coupled to an additional drive circuit 116 which is coupled to $V_P$ of 5 volts. The driver circuit 116 in turn is coupled to a transistor 118 which is coupled through its drain to the gate of the PMOS pull-up transistor 122. The gate of PMOS pull-up transistor 122 is also coupled to the drain of NMOS transistor 124 and the source of NMOS transistor 126. The drain of transistor 126 is in turn coupled to the drain of PMOS transistor 128. The source of transistor 128 is coupled to the gates of transistors 124 and 126.

The drain of transistor 122 is coupled to the pad 130 which could be coupled to a 5 volt source. The NMOS transistors 132 and 134 which are coupled in series with the pad 130 are the pull-down transistors of the output driver circuit. In this embodiment, the gate of transistor 132 is coupled to a 3.3 voltage potential and the gate of transistor 134 is coupled to the output of predriver circuit 114. As shown, transistor 122 is PMOS devices while transistors 132 and 134 are NMOS devices. When both transistors are disabled, the output $V_o$ is free to move between 0 v and 3.3 v, $V_P$ is 3.3 v, and $V_N$ is 0.0.

In this embodiment, NMOS transistor 132 and NMOS transistor 134 are stacked to reduce the gate to source voltage $V_{GS}$ and drain to the source voltage $V_{DS}$ of both of the transistors when the pad is at 5 volts. When node 136 is low, transistor 134 is off and node 137 is at 3.3 volts minus $V_{IN}$ due to the biasing of transistor 132. Transistor 126 and 128 reduce the leakage current through transistor 122. When the output buffer is at high impedance state, the output pad is driven to 5 volts by some external circuit. During this state, node 136 is low, node 138 is high, and transistor 128 is 'on', transistor 126 is also on because the gate voltage (pad/30) is at 5 volts. Node 140 is at (5 volts-$V_{TN}$). Since the source voltage of transistor 122 is only at 3.3 volts, therefore transistor 122 is totally off. Thus, ensuring the leakage current transistor 122 to a minimum.

During normal operation, when node 136 is high, thus turning transistor 134 on. Pad 130 is driven to low stage. Also during normal operation, transistor 128 is turned off. Node 140 is pulled up to 3.3 volts by transistor 124 which is on because of low voltage at pad 130. Similarly, when node 138 is driven low by inverter stage 116 and node 136 is low, node 140 will be also at low state because of the transistor 118, which serves as a pass transistor. As a result, transistor 122 is turned on, pulling pad 130 high, 3.3 volt. Note the transistor 124 is off during this time. With this scheme, when the output stage is a high impedance state and pad 130 is driven by 3.3 volts, potentially transistor 122 is not fully off, because node 140 is at (3.3 volts-$V_{TN}$).

Figure 3:
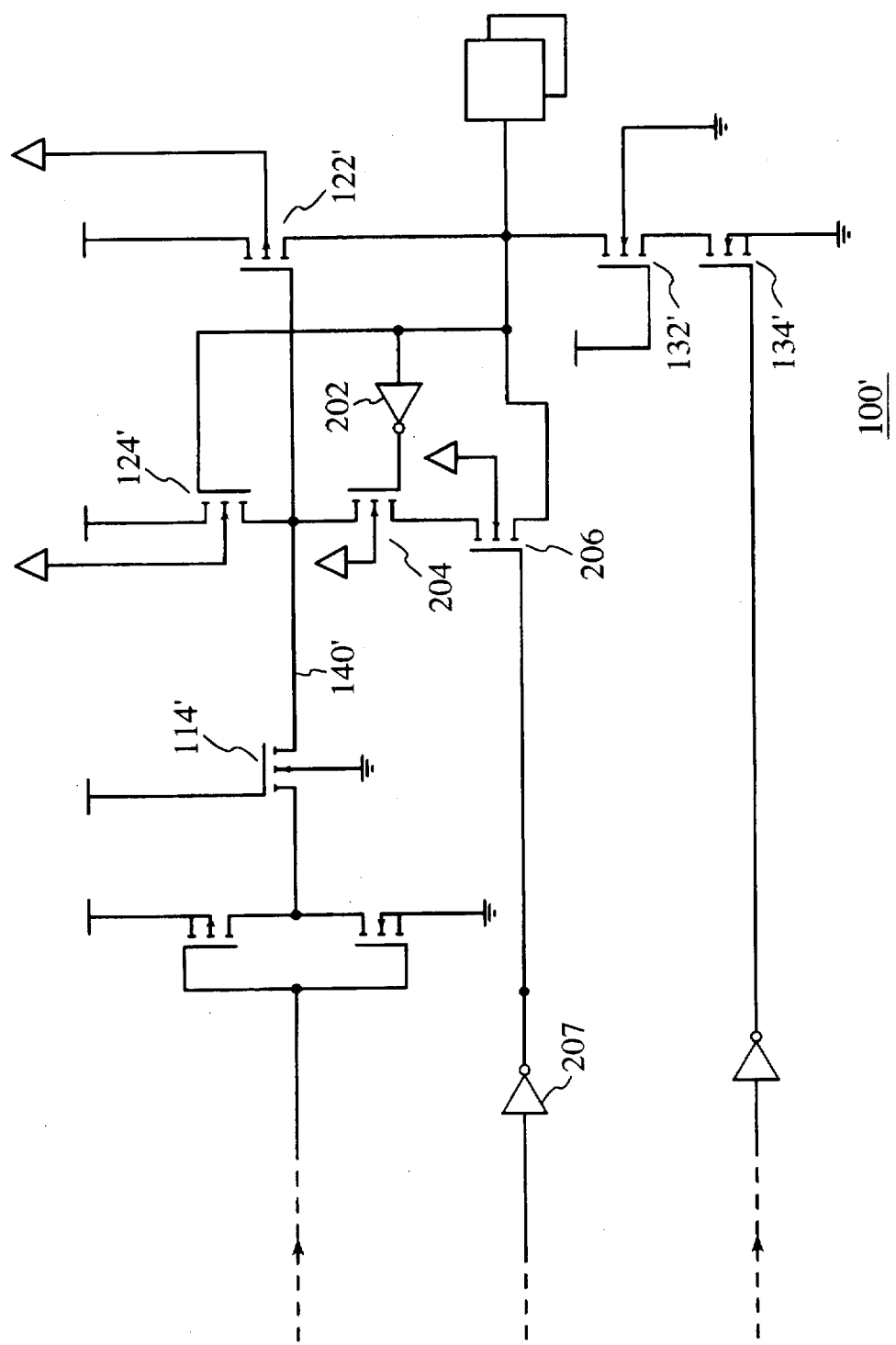
FIG. 3 is a schematic diagram of a second embodiment of an output driver circuit in accordance with the present invention.
Figure 4:
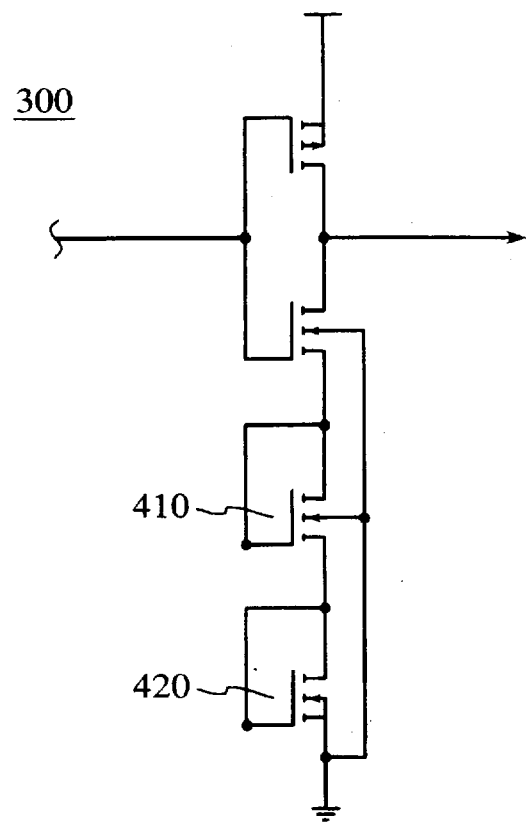
FIG. 4 is a schematic diagram of one embodiment of an inverter circuit 300 which could be utilized for inverters 202 and 207 of FIG. 3.

An improvement of the present invention is shown in FIG. 3, in which NMOS transistor 126 is substituted by the PMOS transistor 204, and inverters 202 and 207 are added. This improvement allows node 140' to reach 3.3 volts thus turning transistor 122' completely. FIG. 4 is a schematic diagram of one embodiment of an inverter circuit 300 which could be utilized for inverters 202 and 207 of FIG. 3. In this inverter circuit, transistors 410 and 420 are diode-connected in order to raise the output of the inverter circuit 300 above 0 volts by two N-channel thresholds. Referring back to FIG. 3, accordingly, inverters 202 and 207 cause the voltage on the gates of transistors 204 and 206 to be at a higher level than 0 volts. Therefore, the reliability of the circuit is improved because the voltage across the gate and channel of the transistor is substantially reduced. With this scheme, during the high impedance state, with pad 130 driven to 3.3 volts or 5 volts, node 140 is guaranteed to be at 3.3 volts or 5 volts, respectively, thus ensuring that transistor 122' is fully off under any voltage level at pad 130.

Figure 5:
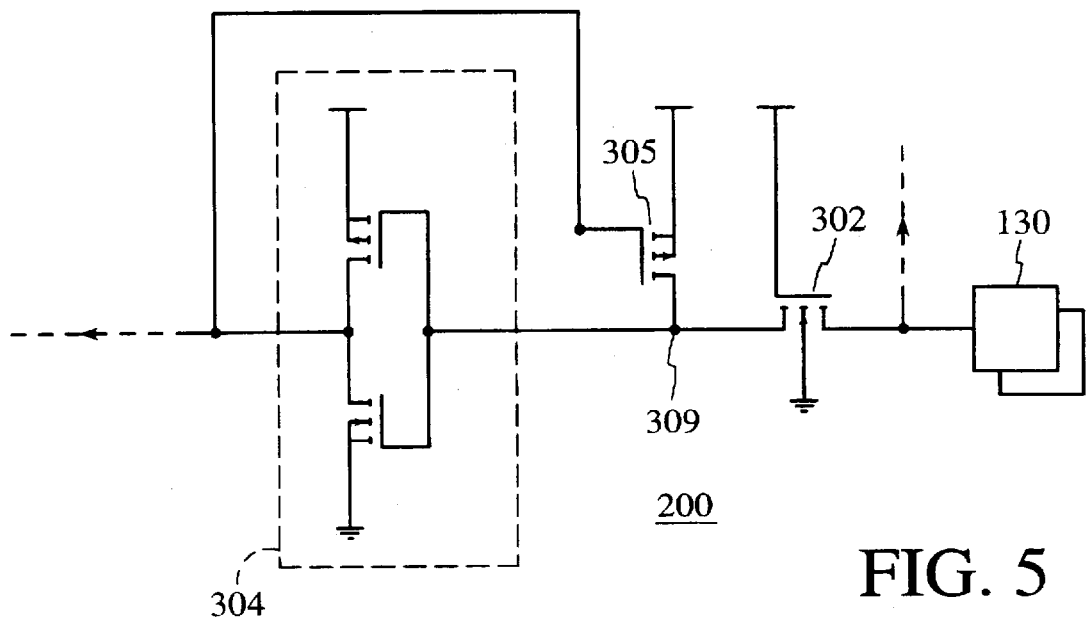
FIG. 5 is a schematic diagram of an input buffer stage in accordance with the present invention.

The present invention can be utilized advantageously with an input buffer stage. Referring now to FIG. 5, an input buffer stage 200 includes a NMOS transistor 302 and an inverter 304. The gate of transistor 302 is coupled to $V_{dd}$ (3.3) volts. The source of transistor 302 is coupled to the pad 130.

PMOS transistor 305 is coupled to the input stage via its gate. The source of transistor 505 is coupled to $V_{dd}$ and the drain of transistor 305 is coupled to the source of transistor 302 via node 309. Transistor 305 pulls up node 309 to $V_{dd}$ (preferably 3.3 volts). Accordingly, transistor 305 substantially reduces the leakage across the inverter 304.

Through the transistor 302, the voltage at the input of the inverter 304 is substantially reduced thereby eliminating the degradation problem for the NMOS transistor 302 of the inverter 304.

Accordingly, an improved output driver circuit that has reduced leakage through the pull-up transistor is disclosed. The output driver circuit can be easily manufactured utilizing existing processes. In addition, this improvement does not require additional die area or the like for implementation on an output driver circuit, while allowing for a high voltage of 5 volts at the pad 130.

Although the present invention has been described in accordance with the embodiments shown, one of ordinary skill in the art will readily recognize that there could be variations to the embodiments and those variations would be within the spirit and scope of the present invention. It should be understood that Accordingly, many modifications may be made by one of ordinary skill in the art without departing from the spirit and scope of the appended claims.

What is claimed is:

1. An output driver circuit comprising:
   a first pull-up transistor means coupled to a first voltage potential;
   a second pull-down transistor means coupled to a second voltage potential;
   a pad member coupled to the first pull-up and second pull-down transistor means;
   a circuit coupled to the pad member and coupled to the first pull-up transistor means, the circuit for substantially reducing the leakage through the first pull-up transistor means when the pad member is coupled to a third voltage potential, the circuit further comprising:
      an inverter coupled at an input to the pad member;
      a third transistor coupled to an output of the inverter and to the gate of the first pull-up transistor means;
      a fourth transistor coupled to the third transistor and to the input of the inverter; and
      a fifth transistor coupled at a drain to the third transistor and at a gate to the input of the inverter.

2. The output driver circuit of claim 1 in which the inverter comprises:
   a plurality of diode-connected transistors.

3. The output driver circuit of claim 1 which is further coupled to an input buffer stage via the pad member, the input buffer stage including a sixth transistor coupled to the pad member and the first voltage potential; a seventh transistor coupled to the input of the input buffer; and a second inverter coupled to the input and the seventh transistor.

4. The output driver circuit of claim 1 in which the third transistor comprises a PMOS transistor.

5. The output driver circuit of claim 4 in which the fourth transistor comprises an NMOS transistor.

6. The output driver circuit of claim 4 in which the fifth transistor comprises an NMOS transistor.

7. The output driver circuit of claim 6 in which the first voltage potential is greater than the second voltage potential and the first voltage potential is less than the third voltage potential.

8. The output driver circuit of claim 7, in which the first voltage potential is substantially 3.3 volts, the second potential is substantially 0 volts, and the third voltage potential is substantially 5 volts.

9. An output driver circuit comprising:

a pull-up transistor coupled to a first voltage potential;

a pull-down transistor coupled to a second voltage potential;

a pad member coupled to the pull-up and pull-down transistors;

an inverter coupled at an input to the pad member; and a PMOS transistor coupled to an output of the inverter and to a gate of the pull-up transistor, the inverter and the PMOS transistor for substantially reducing the leakage through the pull-up transistor when the pad member is coupled to a third voltage potential.

10. The output driver circuit of claim 9 in which the first voltage potential is greater than the second voltage potential and the first voltage potential is less than the third voltage potential.

11. The output driver circuit of claim 10 in which the first voltage potential i substantially 3.3 volts, the second voltage potential is substantially 0 volts, and the third voltage potential is substantially 5 volts.

12. An output driver circuit comprising:

a pull-up PMOS transistor coupled to substantially 3.3 volts;

a pull-down NMOS transistor coupled to substantially 0 volts;

a pad member coupled to the pull-up and pull-down transistors;

an inverter coupled at an input to the pad member; and a second PMOS transistor coupled to an output of the inverter and to a gate of the pull-up PMOS transistor, the inverter and the second PMOS transistor for substantially reducing the leakage through the pull-up transistor when the pad member is coupled to substantially 5 volts.

\* \* \* \* \*